United States Patent [19]
Milkovic

[11] 3,955,138
[45] May 4, 1976

[54] ELECTRONIC ENERGY CONSUMPTION METER WITH INPUT TRANSFORMER HAVING SINGLE RESISTANCE TERMINATED SECONDARY WINDING COUPLED TO C-MOS SWITCHES DRIVEN BY PULSE WIDTH MODULATED CONTROL SIGNALS

[75] Inventor: Miran Milkovic, Scotia, N.Y.

[73] Assignee: General Electric Company, Schenectady, N.Y.

[22] Filed: Nov. 6, 1974

[21] Appl. No.: 521,298

[52] U.S. Cl. ............................ 324/107; 324/127; 324/142
[51] Int. Cl.² .................................. G01R 21/06
[58] Field of Search ........... 324/141, 142, 107, 127; 332/43 R, 43 B

[56] References Cited
UNITED STATES PATENTS
3,602,843    8/1971    Vries ................................... 323/142
FOREIGN PATENTS OR APPLICATIONS
1,154,550    6/1969    United Kingdom ............... 332/43 R
472,677      6/1969    Switzerland ........................ 324/142

OTHER PUBLICATIONS
Friedl et al., "Portable Electronic Watthourmeter—Standard" Published Versions of Lectures Given During the Sept. 1972 IEE Metering Conf. in London Eng. Paper No. 117.

Brunner et al., "Electronic Precision Watthour Meters," Published Versions of Lectures Given During the Sept. 1972 IEE Metering Conf. in London Eng. Paper No. 77.

Primary Examiner—John K. Corbin
Assistant Examiner—Wm. H. Punter
Attorney, Agent, or Firm—Vale P. Myles

[57] ABSTRACT

In the exemplary embodiment, a double-pole double-throw-C-MOS analog switch provides output signals alternately 180° and 0° with respect to the output of a single secondary winding on a current transformer, which single secondary winding is resistance terminated. The switch control signal is pulse-width modulated in proportion to the line voltage thus making the D.C. component of the net output from the analog switch proportional to the instantaneous product of line voltage and line current or power consumption. This power consumption signal is then conventionally processed to provide data indicating the total accumulated energy consumption in the monitored circuit.

8 Claims, 6 Drawing Figures

ELECTRONIC ENERGY CONSUMPTION METER WITH INPUT TRANSFORMER HAVING SINGLE RESISTANCE TERMINATED SECONDARY WINDING COUPLED TO C-MOS SWITCHES DRIVEN BY PULSE WIDTH MODULATED CONTROL SIGNALS

This invention is related to an improvement in electronic energy consumption meters which monitor electrical energy consumption according to the time-division or amplitude-mark-space-modulation technique generally described in detail in my earlier co-pending U.S. applications Ser. No. 361,030 filed May 17, 1973, now U.S. Pat. No. 3,875,509 and Ser. No. 395,142 filed Sept. 7, 1973, now U.S. Pat. No. 3,875,508. The entire disclosure of these earlier co-pending applications is hereby incorporated by reference. The entire right, title and interest in and to the inventions described in the aforesaid patent applications and the entire right, title and interest in and to the invention herein disclosed, as well as in and to the patent application of which this specification is a part, are assigned to the same assignee.

The basic time-division or amplitude-markspace-modulation technique (it is commonly referred to by these and/or similar names in the art) is also disclosed elsewhere in the art such as in U.S. Pat. No. 3,602,843; Canadian Pat. No. 801,200; Swiss Pat. No. 472,677 and in various publications such as various of the published papers presented at the I.E.E. Metering Conference held in London, England, during September of 1972.

As in all electrical power/energy consumption meters, the general problem is to multiply two analog variables (electrical voltage and current flowing in the monitored circuit) so as to obtain a measure of power (i.e., the rate of energy consumption) and then to integrate the power consumption so as to obtain a measure of the actual energy consumption. In time-division or amplitude-markspace modulation types of electronic energy consumption meters such as those described in my earlier referenced co-pending applications, the multiplication of the two analog variables is achieved by alternately switching the polarity of one of the signals in response to a control signal that is pulse-width modulated in proportion to the other variable. The result is a pulse train wherein the instantaneous pulse-height is proportional to one variable and the instantaneous pulse-width is proportional to the other variable. Accordingly, the D.C. component of the resultant width and amplitude modulated pulse train is proportional to power consumption.

In my earlier above-referenced co-pending applications, the inverted form of the first signal variable was provided by including an active element inverter such as an amplifier having a gain of one. (For instance, see inverter 52 in FIGS. 14 and 20 of my application Ser. No. 361,030, now U.S. Pat. No. 3,875,509. Others have approached the problem in various manners such as by providing two oppositely phased secondary windings on the current transformer. (See, for instance, R. Friedl, W. Lange, P. Seyfried: Electronic Three-Phase Four-Wire Power-Frequency Converter with High Accuracy over a wide range of use; I.E.E.E. Transactions on Instrumentation and Measurements, Volume IM-20, No. 4, November, 1971.

However, the provision of extra current transformer windings, inverter circuits, etc., inevitably provides additional expense and potential error sources while also unnecessarily complicating the circuit complexity and increasing the power consumption of the metering circuits. A substantial simplification in the circuitry required for this time-division or amplitude-mark-space-modulation multiplication technique can be effected by utilizing a single current transformer secondary winding in conjunction with a double-pole double-throw switch controlled by the output of a pulse-width modulator in proportion to the second variable as shown, for instance, in FIG. 1 of Swiss Pat. No. 472,677. However, it has been discovered that the simplified circuitry shown in Swiss Pat. No. 472,677 can still be considerably improved. In particular, the circuitry shown in Swiss Pat. No. 472,677 requires the entire current transformer output current to be switched by an electronic switch thus producing an objectionable degree of switching transients, which, in turn, inevitably affect the accuracy of the overall multiplying circuit. Furthermore, when such high magnitude currents are directly switched, the power consumption and rating of the electronic switch must be unnecessarily high. Finally, the transformer secondary winding load is substantially influenced by the input impedance of amplifiers, etc., so as to cause potential phase changes between the monitored primary transformer current and the resultant secondary transformer current actually switched to provide the amplitude and width modulated pulses.

According to the present invention, the shortcomings of such simplified multiplying circuitry as shown in Swiss Pat. No. 472,677 are overcome by directly terminating the secondary winding of the current transformer with a fixed resistance of a predetermined low value. Since this resistive load of relatively low value is connected directly in shunt across the secondary winding of the current transformer, only a relatively small current is actually switched by the electronic switch thus reducing undesirable switching transients and making it possible to use electronic switch components having a lower power rating. In addition, since the resistive termination of the current transformer secondary is small compared to the effective parallel impedance of subsequent amplifier input circuits, etc., phase shifts between the primary and secondary currents in the current transformer are minimized. Accordingly, it has been discovered that the provision of such a resistive secondary termination, although a relatively simple change in retrospect, produces a rather surprising and substantive improvement in the overall operation of such electronic energy consumption meters.

The circuit of this invention is also suitably simplified so as to facilitate monolithic circuit integration and results in minimizing the power consumption in the current transformer load resistor and reductions in the necessary size and cost of the current transformer.

In one preferred embodiment, the unit is selfcontained in that power for the circuitry is obtained directly from one of the monitoring transformers (i.e. the potential and current transformers).

These and other objects and advantages of the invention will be more clearly appreciated by reading the following detailed description taken in conjunction with the accompanying drawings, in which.

Figure 1:
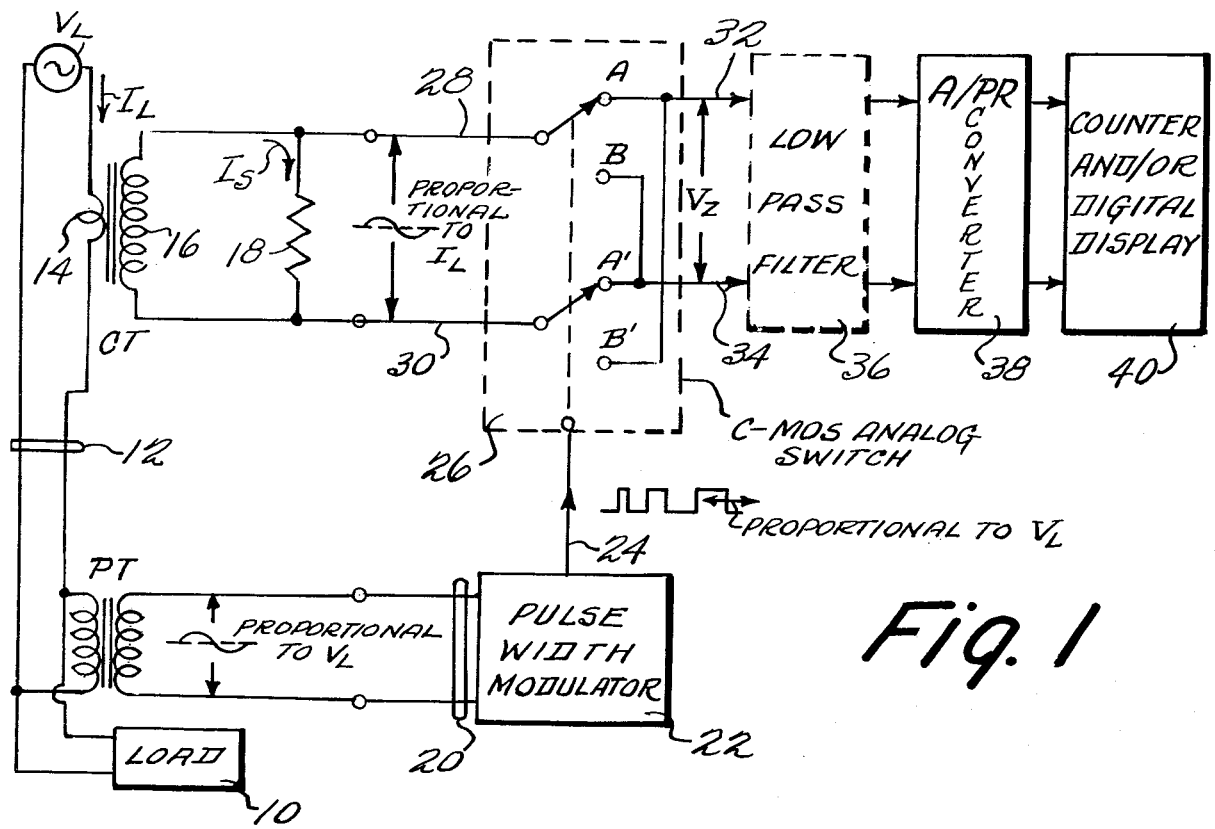
FIG. 1 is a schematic diagram of an improved electronic energy consumption meter according to this invention.

The invention as shown in FIG. 1 is an electronic energy consumption meter for monitoring the electrical energy consumed in load 10 via an electrical circuit 12 having a line voltage $V_L$ and a line current $I_L$. The primary winding 14 of the current transformer CT is connected in series with the line current $I_L$ while the primary winding of a potential transformer PT is connected in parallel across the line voltage $V_L$.

The current transformer CT has a single secondary winding 16 producing a current $I_S$ proportional to the line current $I_L$. Since a shunt resistance 18 is connected directly across the secondary winding 16 of the current transformer CT, and since the resistance value of the shunt resistance 18 is considerably lower than the effective parallel resistance of other connected circuitry shown to the right in FIG. 1, most of the secondary current $I_S$ flows through the shunt resistance 18 as shown by the arrow in FIG. 1. Thus, to the right of shunt resistance 18 in FIG. 1, there is a voltage substantially proportional to $I_L$ as indicated. The current actually flowing to the right of the shunt resistance 18 is thus considerably reduced. The exact value for the shunt resistance 18 would, of course, have to depend upon specific design parameters for a particular circuit. In general, it should be chosen to be as small as possible while yet providing a voltage signal of sufficient magnitude thereacross to drive the remaining circuitry to the right of shunt 18 in FIG. 1 at the lowest current values for which measurements are to be recorded. Typically, the resistance value of the shunt 18 may be approximately 50-100 ohms.

The secondary voltage on the potential transformer PT is proportional to the line voltage $V_L$ as also indicated in FIG. 1. Thus, the voltage analog variable is presented to input 20 of a pulse-width modulator 22. The pulse-width modulator 22 may, for example, be of the type shown in FIGS. 14 and 20 of my earlier above-referenced co-pending application 361,030 (U.S. Pat. No. 3,875,509). In particular, the pulse-width modulator 22 is of a type which produces width modulated pulses at an output 24 wherein the instantaneous pulse-width of an output pulse is proportional to the corresponding instantaneous magnitude of the input voltage variable at the input 20 of the pulse-width modulator. Typically, the sampling frequency of the pulse-width modulator is fixed at some relatively high value (i.e., the sampling rate can be on the order of 10,000 Hz as compared to a line frequency of 60 Hz) so that a large number of width modulated pulses are produced at output 24 for each cycle of line voltage/current.

As shown in FIG. 1, a double-pole double-throw analog switch 26 is controlled by the pulse-width modulator output 24. The inputs 28, 30 to the analog switch 26 are taken from the secondary of the current transformer in parallel with the shunt resistance 18. The analog switch 26 is connected such that the two input lines 28 and 30 are controllably and alternatively connected to the two output lines 32 and 34 respectively in a first state A–A' of the switch 26 and then to the output lines 34 and 32 respectively in the second stage B–B' of the switch 26.

Figure 2:
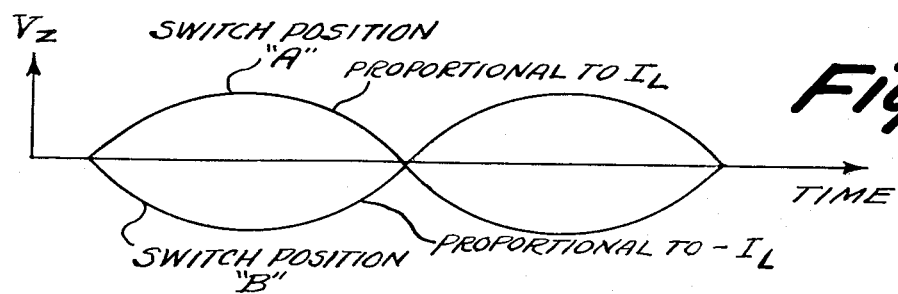
FIGS. 2 and 3 are graphical presentations of wave forms for electrical signals in the circuitry of FIG. 1 and useful in explaining the operation of that circuitry.
Figure 3:
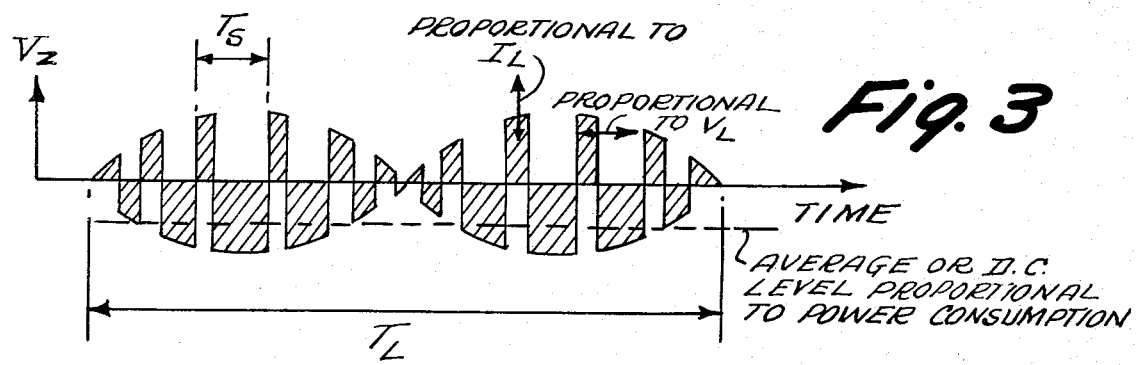

If the switch 26 were constantly left in state A–A', the output would be continuously proportional to $I_L$ as shown in FIG. 2. On the other hand, if switch 26 were continuously left in state B–B' then the output would constantly be proportional to $-I_L$ as also shown in FIG. 2. Actually, the state of switch 26 is controlled by the pulsewidth modulated output of modulator 22 so that the actual output $V_Z$ is shown in FIG. 3 as alternating between a signal proportional to $I_L$ and a signal proportional to $-I_L$. Thus, the net output $V_Z$ is a train of pulses which alternate in polarity and wherein the instantaneous magnitude of any given pulse is proportional to the line current $I_L$ while the instantaneous width or mark-space ratio of the pulses is proportional to the line voltage $V_L$. As explained in great detail in my earlier referenced co-pending applications, this results in a signal having a D.C. component proportional to power consumption as also indicated in FIG. 3. The sampling period $T_s$ shown in FIG. 3 is exaggerated for purposes of illustration since in actual practice the period $T_s$ would be very much smaller (i.e., perhaps 1/100 or so) of the line period $T_L$.

While switch 26 has been only diagrammatically shown in FIG. 1, those in the art will recognize that in actual practice switch 26 would be realized as a plurality of active electronic switch elements controlled by the electronic output 24. Preferably switch 26 is realized as C-MOS devices such as conventionally available in the art or as C-MOS elements which are integrally formed in a monolithic integrated circuit together with other of the circuitry shown in FIG. 1 according to conventional integrated circuitry construction techniques.

Referring back to FIG. 1, the signal $V_Z$ having a D.C. component proportional to power consumption is then passed through a low-pass filter to isolate the D.C. component which is thereafter processed in an analog-to-pulse-rate converter 38 which effectively integrates the D.C. component and provides a unit-energy output pulse at its output terminals each time a predetermined fixed unit amount of energy has been consumed. These unit-energy output pulses are counted and possibly displayed in an accumulator means 40 which effectively counts the number of such unit-energy output pulses thus accumulating data indicating the total energy consumption in the load 10.

It should also be appreciated that although the invention has been described so far in detail only with respect to a single phase circuit 12 in FIG. 1, the invention is also applicable to plural N-phase electric energy consumption meters. Usually, in such meters, Blondel's theorem is utilized so that it is only necessary to actually monitor the current and voltage variables in N-1 of the phases of such a plural phase electric circuit. The details of such a monitoring technique are described in my earlier referenced co-pending application Ser. No. 361,030 (U.S. Pat. No. 3,875,509). The present invention as disclosed in FIG. 1 might be utilized in such a plural N-phase electric energy consumption meter, for instance, by providing current and potential transformers, fixed terminating resistance for the current transformer secondary, pulse-width modulator and doublepole double-throw switches as in FIG. 1 for each of at lease N-1 of the electrical phases. The pulse train outputs from the N-1 analog switches might then be electrically summed together and presented in summation as a single input to the low-pass filter 36, etc., as shown in FIG. 1. It should also be noted that the low-pass filter 36 might be effectively combined with the A/PR converter 38 if the A/PR converter 38 itself possesses low-pass filter characteristics. The A/PR converter shown in FIG. 4 possesses such low-pass filter characteristics.

Figure 4:
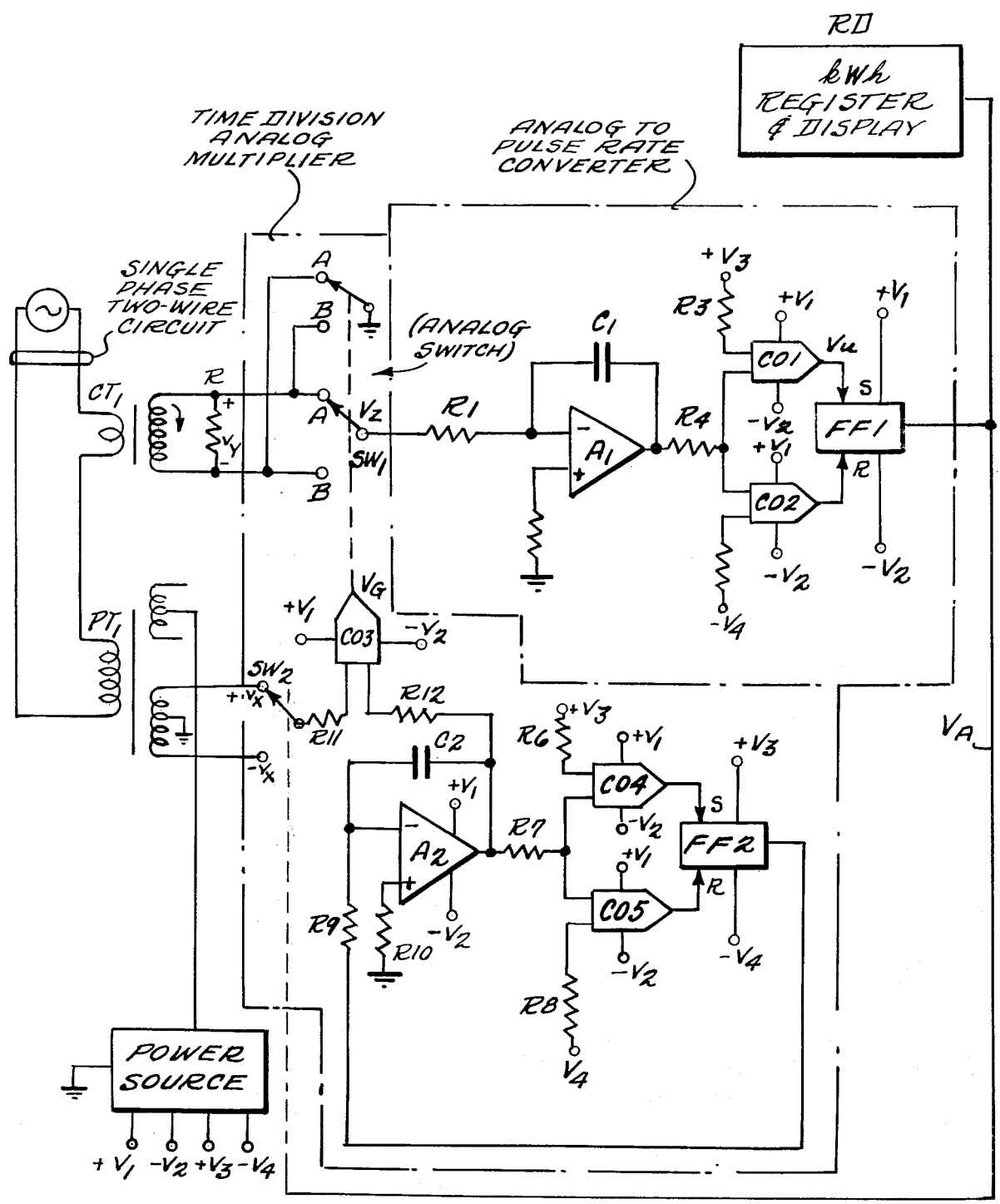
FIG. 4 is a more detailed schematic diagram of a single phase two-wire watt-hour meter according to this invention.

FIG. 4 shows the circuit configuration of a single-phase two-wire electronic kWh meter using a pulse-widthamplitude type (or time division) multiplier having no separate low-pass filter. It comprises a pulse-width modulator C03, an analog switch SW-1 and a triangular generator formed by $A_2$, C04 and C05 and FF2. The output $V_G$ from C03 is a pulse-width modulated pulse train having a pulse width, proportional to the amplitude of $v_X$, and a frequency $f_S$ determined by the triangular generator, usually about 6 kHz or more. Signal $v_X$ is proportional to the line voltage; signal $v_Y$ is proportional to the current in the CT primary. The multiplier output signal $v_Z$ is obtained by modulating $\pm v_Y$ with $v_G$. The phase inverted signal $\pm v_Y$ required for proper multiplication is obtained by a single terminating resistor R at the current transformer CT1 secondary and by the double-pole, double-throw C-MOS analog switch SW1, which operates at the sampling frequency $f_S$ of about 6 kHz or more. Since $f_S >> f_L$ where $f_L$ is the line frequency, the output signal $v_Z$ is a sampled signal as shown in FIG. 3. During the positive half period of the pulse width modulated signal from C03, the upper part of the switch SW1 grounds in position A the negative side of $v_Y$ and the output $v_Z$ goes positive during the first pulse time-interval. In the next pulse time-interval, the switch SW1 changes its position to B and the upper switch grounds the positive side of $v_Y$, thus $v_Z$ becomes negative during this second interval. Since the first pulse time-interval is a function of $v_X$ it is apparent that $v_Z$ is proportional to the product of $v_X$ and $v_Y$.

This single resistor CT termination substantially decreases the AC-power dissipation in the current transformer secondary load. It also permits the use of a single $\pm 1\%$ low TC resistor rather than two 0.1% matched low TC precision resistors per channel and allows a substantial reduction in the size and cost of the necessary current transformer.

The analog to pulse-rate converter in FIG. 4 comprises an up-down integrator $R_1$, $C_1$ and $A_1$, two comparators CO-1 and CO-2 and a flip-flop FF1. During a first time $t_o-t_1(T_A)$ the capacitor $C_1$ is charged by the average signal $-\bar{v}_Z$ and by an error signal $V_\epsilon$ which represents the total system error signal referred to the integrator input. At $t = t_1$ the voltage $v_C$ becomes equal to the reference voltage $+V_3$ and the voltage $v_u$ at the output of the upper comparator C0-1 changes its state from zero to $+V$ and sets FF1, thus $v_A$ changes the state from zero to $+V$. The switch SW-2 is now activated and it switches the C03 input to $-v_X$. Therefore $v_Z$ changes polarity and the integrator starts to integrate down during $t_1$ to $t_2$ $(T_B)$ with an average signal $+\bar{v}_Z$ and with the error signal $V_\epsilon$. Since $v_Z$ does change the sign by switching of $v_X$ but $V_\epsilon$ does not, the error is added during $T_A$ and subtracted during $T_B$. The error thus averages out during the overall measurement period $T_A + T_B$. Also, since $+\bar{v}_Z$ and $-\bar{v}_Z$ are average D.C. type signals which are directly integrated, no separate low pass filter is needed to isolate D.C. components.

Figure 5:
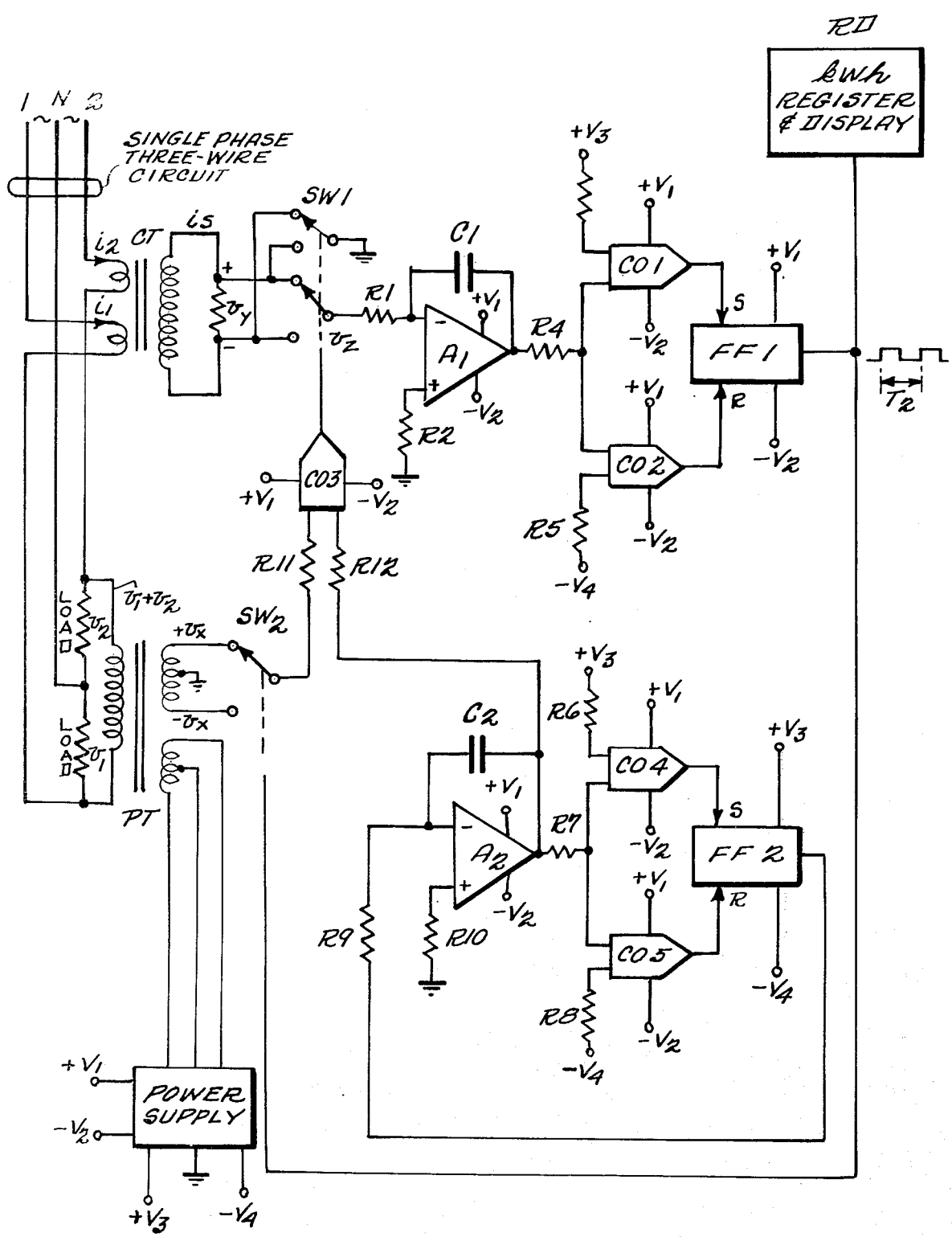
FIG. 5 is a schematic diagram of a single phase three-wire watt-hour meter according to this invention.
Figure 6:
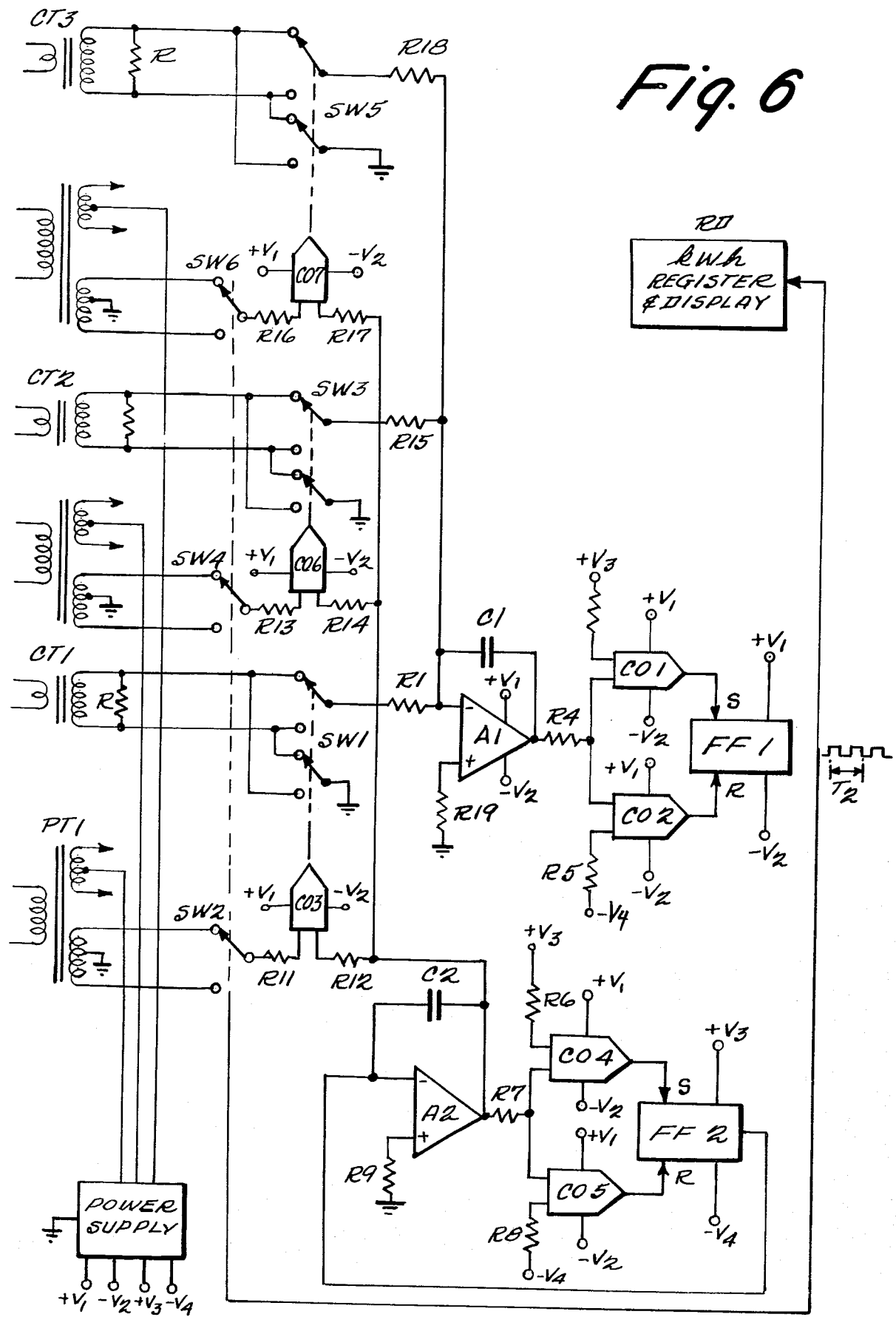
FIG. 6 is a schematic diagram of a three phase three and four-wire watt-hour meter according to this invention.

The proposed method of terminating a current transformer with a single resistor can be applied also to any other combination or function of electronic metering. In FIG. 5, for example, a configuration of a single phase-three wire electronic kWh-meter is shown and in FIG. 6 a polyphase electronic kWh-meter is shown. AC power for the power supply is obtained in all versions from the potential transformer secondaries thus making all these units self-contained. The detailed operation of the circuits shown in FIGS. 5 and 6 is directly analogous to that already discussed with respect to FIG. 4 so that further detailed discussion is not believed necessary.

Although this invention has been described with respect to a few particular exemplary embodiments, those in the art will appreciate that it is possible to modify many features of the exemplary embodiments without departing from the improved teachings and features of this invention. Accordingly, all such modifications are intended to be incorporated within the scope of this invention.

What is claimed is:

1. In an electronic energy consumption meter for monitoring electrical energy consumption represented by electric current and voltage signals according to the time-division or amplitude-mark-space-modulation method, the improvement comprising:

a first transformer having a primary winding connected to receive one of said signals to be monitored and a secondary winding providing a first signal proportional thereto, a second transformer having a primary winding connected to receive the remaining one of said signals to be monitored and a single secondary winding providing a second signal proportional thereto, a fixed resistance of predetermined value in the range of approximately 50 to 100 ohms connected in shunt across said secondary winding of said second transformer, a pulse-width modulator operatively connected to receive said first signal and to produce repetitive modulated output pulse signals having instantaneous pulse-widths proportional to the corresponding instantaneous magnitude of said first signal, and a double-pole double-throw electronic switch operatively connected to be automatically switched between two possible states in response to said repetitive modulated output pulse signals, said switch having first and second inputs connected across the single secondary winding of said second transformer, and said switch having first and second outputs which are controllably and alternatively connected to said first and second inputs respectively in the first switch state and to said second and first inputs respectively in the second switch state in response to said modulated output signals whereby the resultant electrical signal across said first and second switch outputs comprises pulse-widthamplitude modulated pulses having instantaneous widths proportional to said first signal, instantaneous amplitudes proportional to said second signal and a D.C. component proportional to the product of said first and second signals and hence to the power consumption represented by the monitored electric current and voltage signals.

2. An improvement as in claim 1 wherein said first transformer is a potential transformer having a primary winding connected in parallel across said electric voltage signal to be monitored and said second transformer is a current transformer having a primary winding connected in series with said electric current signal to be monitored.

3. An improvement as in claim 1 wherein said meter is for monitoring plural N-phase electric energy consumption and wherein said first and second transformers, said fixed resistance, said pulse-width modulator and said double-pole double-throw switch are similarly provided for at least N−1 of the phases.

4. An improvement as in claim 1 further comprising a power supply electrically connected to said first transformer for supplying electrical power to the circuits of said meter.

5. An electronic energy consumption meter for monitoring electrical energy consumption represented by electric current and voltage signals according to the time-division or amplitude-mark-space-modulation method, said meter comprising:
   a first transformer having a primary winding adapted for connection to receive one of said signals to be monitored and a secondary winding for providing a first signal proportional thereto,
   a second transformer having a primary winding adapted for connection to receive the remaining one of said signals to be monitored and a single secondary winding for providing a second signal proportional thereto,
   a fixed resistance of predetermined value in the range of approximately 50 to 100 ohms connected in shunt across said secondary winding of said second transformer,
   a pulse-width modulator connected to receive said first signal and to produce repetitive modulated output pulse signals having instantaneous pulse-widths proportional to the corresponding instantaneous magnitude of said first signal,
   a double-pole double-throw electronic switch operatively connected to be automatically switched between two possible states in response to said repetitive modulated output pulse signals,
   said switch having first and second inputs connected across the secondary winding of said second transformer,
   said switch having first and second outputs which are controllably and alternatively connected to said first and second inputs respectively in the first switch state and to said second and first inputs respectively in the second switch state in response to said modulated output signals whereby the resultant electrical signal across said first and second switch outputs comprises pulse-width-amplitude modulated pulses having instantaneous widths proportional to said first signal, instantaneous amplitudes proportional to said second signal and a D.C. component proportional to the product of said first and second signals and hence to the power consumption represented by the monitored electric current and voltage signals,
   a low-pass filter connected to receive said pulse-width-amplitude modulated pulses and to provide a power output signal proportional to the D.C. component of said pulse-width-amplitude modulated pulses,
   an analog-to-pulse-rate converter connected to receive said power output signal and to effectively integrate same and to provide a unit-energy output pulse each time a predetermined fixed unit amount of energy has been consumed, and
   accumulating means connected to count the number of such unit-energy output pulses so produced and thus to accumulate data indicative of the total energy consumption represented by said electric current and voltage signals.

6. A meter as in claim 5 wherein said first transformer is a potential transformer having a primary winding connected in parallel across said electric voltage signal to be monitored and said second transformer is a current transformer having a primary winding connected in series with said electric current signal to be monitored.

7. A meter as in claim 5 adapted for monitoring plural N-phase electric energy consumption and wherein said first and second transformers, said fixed resistance, said pulse-width modulator and said double-pole double-throw switch are similarly provided for at least N−1 of the phases and wherein the plural pulse-width-amplitude modulated pulses thereby produced are summed together and presented in summation as a single input to said low-pass filter.

8. A meter as in claim 5 further comprising a power supply electrically connected to said first transformer for supplying electrical power to the circuits of said meter.

* * * * *